United States Patent [19]
Roohparvar

[11] Patent Number: 5,680,352
[45] Date of Patent: *Oct. 21, 1997

[54] CIRCUIT FOR GENERATING A DELAYED STANDBY SIGNAL IN RESPONSE TO AN EXTERNAL STANDBY COMMAND

[75] Inventor: Fariborz F. Roohparvar, Cupertino, Calif.

[73] Assignee: Micron Quantum Devices, Inc., Santa Clara, Calif.

[*] Notice: The term of this patent shall not extend beyond the expiration date of Pat. No. 5,524,096.

[21] Appl. No.: 660,204

[22] Filed: Jun. 3, 1996

Related U.S. Application Data

[63] Continuation of Ser. No. 496,436, Jun. 29, 1995, Pat. No. 5,524,096.
[51] Int. Cl.$^6$ .................................................. G11C 7/00
[52] U.S. Cl. ................. 365/194; 365/233.5; 365/189.05
[58] Field of Search .............................. 365/194, 233.5, 365/189.05

[56] References Cited

U.S. PATENT DOCUMENTS

| | | | |
|---|---|---|---|
| 4,959,816 | 9/1990 | Iwahashi et al. | 365/233.5 |
| 4,983,861 | 1/1991 | Kikuchi et al. | 307/443 |
| 5,524,096 | 6/1996 | Roohparvar | 365/194 |

Primary Examiner—Joseph A. Popek
Attorney, Agent, or Firm—Limbach & Limbach LLP

[57] ABSTRACT

A circuit which responds to an external standby command (a transition in a chip enable signal from an external device) by generating a delayed internal standby signal. The internal standby signal functions by switching selected components of the circuit (such as address buffers) from an active mode to a standby mode. In preferred embodiments, the circuit is a memory circuit implemented as an integrated circuit. The amount of the delay in generating the delayed internal standby signal is selected to achieve a desired decreased average response time to a sequence of commands (such as memory access commands) without excessive power consumption. In embodiments in which the circuit is a memory chip (such as a flash memory chip) having address access time in the range from 60 ns to 80 ns, the delay typically is from about 100 ns to about 200 ns. In some embodiments, the circuit generates two internal standby signals, one delayed relative to the other, in response to an external standby command (a first type of transition in a chip enable signal from an external device). In these embodiments, a first component receives the delayed internal standby signal (and enters a standby mode in response) and a second component receives the non-delayed internal standby signal (and enters a standby mode in response). In response to an external enable command (a second type of transition in the chip enable signal from the external device), the circuit generates two internal enable signals which enable the first and second components substantially simultaneously.

13 Claims, 5 Drawing Sheets

CIRCUIT FOR GENERATING A DELAYED STANDBY SIGNAL IN RESPONSE TO AN EXTERNAL STANDBY COMMAND

This is a continuation of application Ser. No. 08/496,436, filed Jun. 29, 1995, now U.S. Pat. No. 5,524,096.

BACKGROUND OF THE INVENTION

1. Field of the Invention

The present invention relates to a class of electronic circuits (e.g., integrated circuits) in which an internal control signal is generated (to switch components of the circuit between an "active" and a "standby" mode) in response to a transition in an external control signal (commonly known as a "chip enable" or "CE" signal) from an external device. In accord with preferred embodiments of the invention, a memory chip (an integrated circuit) generates two internal standby signals (one delayed with respect to the other) in response to an external standby command (a transition in a chip enable signal), at least one component circuit of the chip (e.g., an address buffer) receives the delayed internal standby signal, and at least one other component circuit of the chip receives the non-delayed internal standby signal.

2. Description of Related Art

Figure 1:
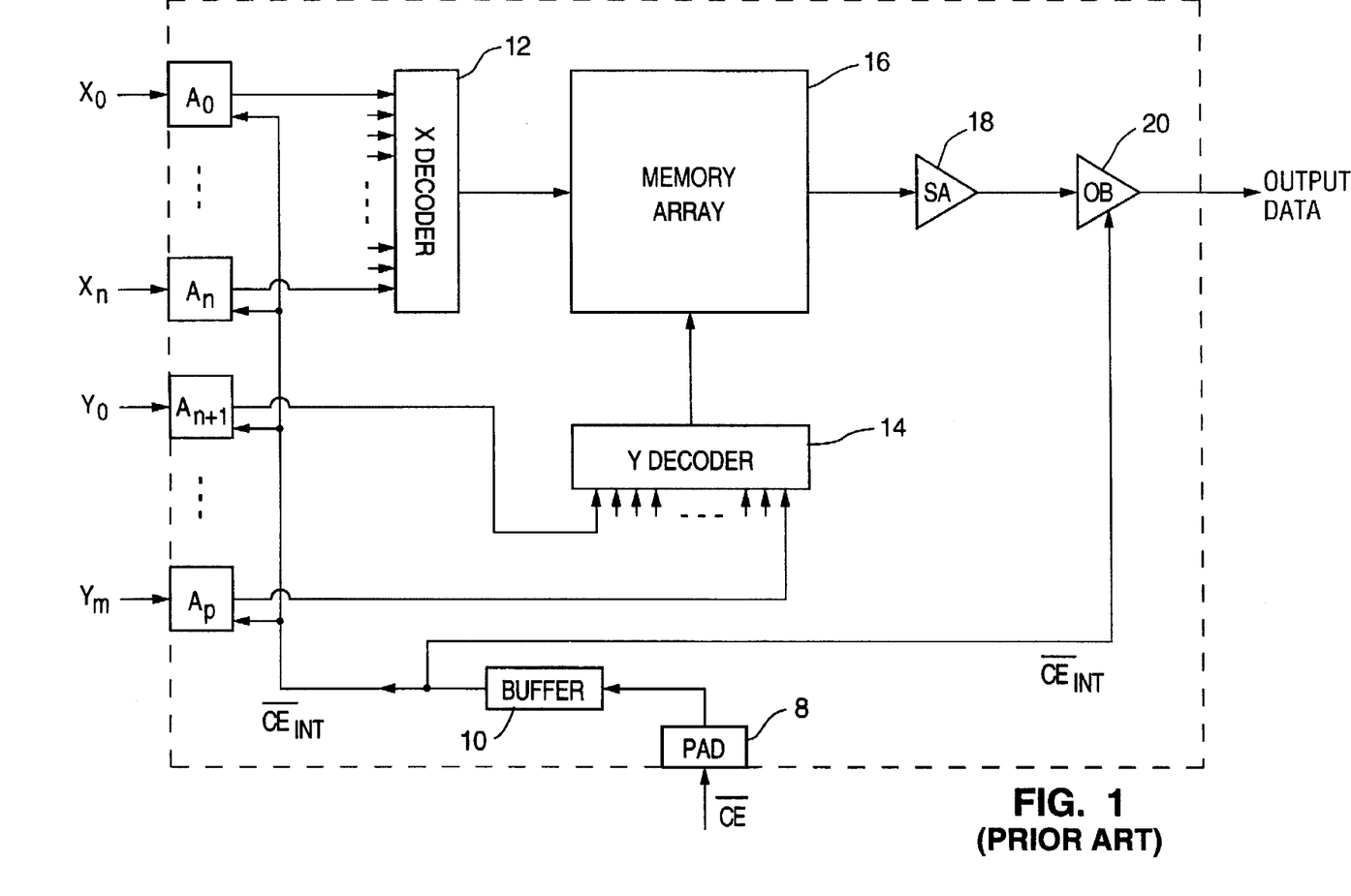
FIG. 1 is block diagram of a conventional integrated circuit, including chip enable buffer 10 for generating an internal chip enable signal (-CEInt) in response to a chip enable command (-CE).

For convenience, the following notation is used in the description of the drawings (FIGS. 1-7). The symbol -N (where "N" is any signal name) is used in the specification to denote a signal identified by the corresponding symbol $\overline{N}$ in the drawings. For example, the signal identified as "$\overline{CE}$" in FIG. 1 is identified in the specification as "-CE."

The description of FIGS. 1-7 assumes that each signal -N represents a logical "1" when its value (e.g., voltage level) is low (below a threshold), and represents a logical "0" when its value is high (above the threshold). Of course, it is within the scope of the invention to employ circuitry implementing the logical functions described with signals having the opposite polarities.

Many conventional integrated circuits (such as memory circuits) operate in either a "standby" mode in which all but essential component circuits are shut off to save power, or an "active" (or "enabled") mode in which all component circuits are enabled to perform their intended functions. Typically, such circuits have a pad (known as a "chip enable," "CE," or "-CE" pad) to which an external device asserts a "chip enable" command signal. Such a command signal is a digital signal whose level indicates either that the integrated circuit should operate in a standby mode, or that the integrated circuit should operate in an active mode.

For example, FIG. 1 is a simplified block diagram of a conventional CMOS memory circuit (an integrated circuit) which includes the following components: address buffers A0 through Ap, chip enable buffer 10, address decoder circuits 12 and 14, memory array 16, sense amplifier 18, and output buffer 20. Each of the storage locations of memory array circuit 16 is indexed by a row index (an "X" index output from decoder circuit 12) and a column index (a "Y" index output from decoder circuit 14).

In the FIG. 1 circuit, each of address buffers A0 through Ap is connected to a different address bit pad, and each receives (from an external device) a different one of address bit signals X0 through Xn and Y0 through Ym. Each of address buffers A0 through Ap is enabled by chip enable signal -CEint supplied thereto from buffer 10.

An external device asserts command signal -CE to chip enable pad 8 of FIG. 1. Chip enable buffer circuit 10 receives

2 signal -CE, and generates chip enable signal -CEint in response to signal -CE as follows:

when -CE is low (its value represents a logical "1"), -CEint is low (and -CEint serves to enable all component circuits, such as address buffers A0 through Ap, to which circuit 10 asserts it); and when -CE is high, -CEint is high (and -CEint serves to put into a standby mode all component circuits to which circuit 10 asserts it).

In the standby mode (in response to a high value of -CEint), address buffers A0 through Ap are disabled and consume much less power than when enabled by a low value of -CEint.

In the active mode (when enabled by a low value of -CEint), address buffers A0 through Ap operate as follows. Each of address buffers A0 through An asserts one of bits X0-Xn to address decoder circuit 12, and each of address buffers An+1 through Ap asserts one of bits Y0-Ym to address decoder circuit 14. In response to these address bits, circuit 12 asserts a row address to memory array 16 and circuit 14 asserts a column address to memory array 16. In response to a memory access command (a read or write command supplied to array 16 from control circuitry not shown in FIG. 1), data is read from or written to the storage location of array 16 determined by the row and column address. When the memory access command is a "read" command, array 16 outputs to sense amplifier 18 a data signal indicative of the data value stored in the storage location determined by the row and column address, amplifier 18 asserts a corresponding amplified data signal to output buffer 20, and output buffer asserts a corresponding "OUTPUT DATA" signal at an external pin of the FIG. 1 circuit.

Figure 2:
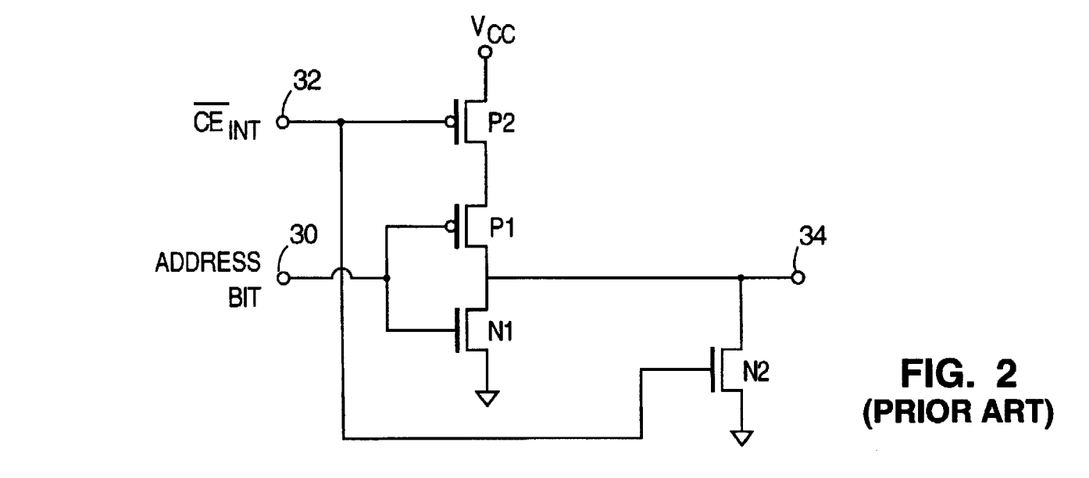
FIG. 2 is a schematic diagram of an address buffer circuit used in the FIG. 1 circuit.

FIG. 2 is a typical implementation of one of the address buffers (A0 through Ap) of FIG. 1. The address buffer of FIG. 2 receives an address bit signal (one of X0-Xn and Y0-Ym) at pad 30, and it receives chip enable signal -CEint at node 32. The FIG. 2 circuit includes P-channel MOS transistor P2, N-channel MOS transistor N2, and a CMOS inverter comprising P-channel MOS transistor P1 and N-channel MOS transistor N1. The source of P2 is connected to supply voltage $V_{cc}$, the drain of P2 is connected to the source of P1, the drain of P1 is connected to the source of N1, and the drain of N1 is connected to ground. The gate of each of transistors P2 and N2 is connected to node 32, so that when -CEint is low (i.e., the FIG. 2 circuit is in an active mode) transistor P2 is "on" and transistor N2 is "off." In the "active" mode, the FIG. 2 circuit responds to TTL level voltages at pad 30 (each determining an address bit) as follows. When pad 30 is low, transistor P1 is "on" and transistor N1 is "off," so that the voltage level of output node 34 is pulled "high" by $V_{cc}$. When pad 30 is high, transistor P1 is "off" and transistor N1 is "on," so that output node 34 is pulled "low." In its active mode, the address buffer shown in FIG. 2 typically draws DC current on the order of 50–100 microamps. In typical implementations of FIG. 1 including eighteen to twenty address buffers, when the address buffers are active, the address buffers (and the other circuitry operating in response to the active address buffers) will draw a total of on the order of 20–40 milliamps. If there were twenty memory chips (of the FIG. 1 type) on a single board, the standby mode could thus reduce the board's power requirements by several hundreds of milliamps.

When -CEint is high (i.e., when the FIG. 2 circuit is in its standby mode) transistor P2 is "off" and transistor N2 is "on." In this standby mode, output node 34 remains "low"

regardless of the level of input pad 30, and the FIG. 2 circuit consumes no power.

Figure 3:
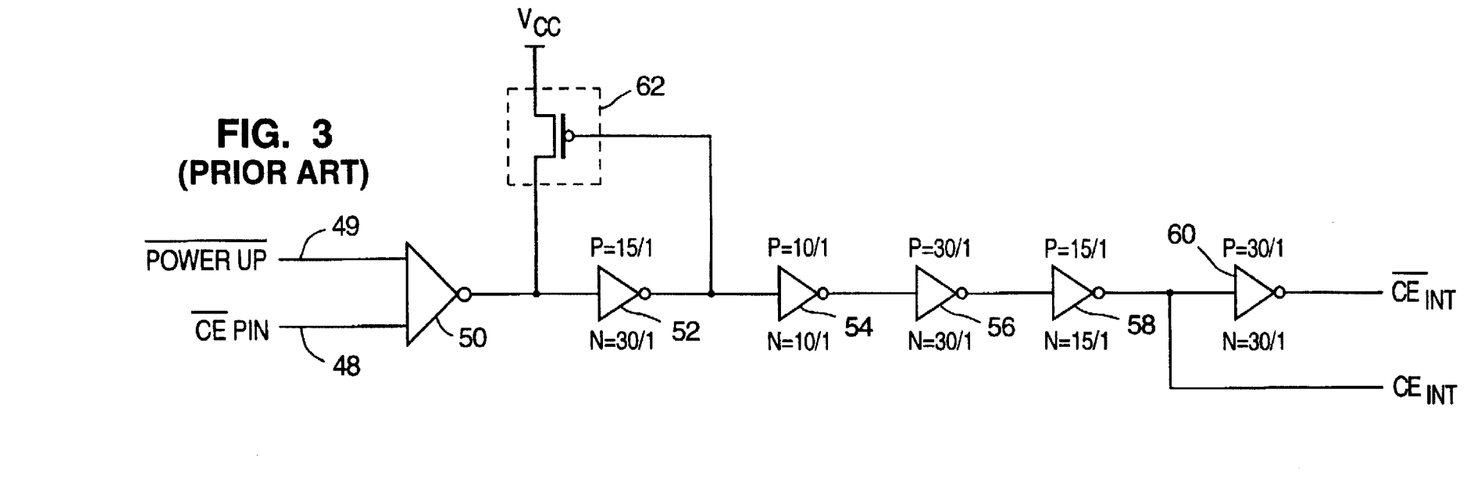
FIG. 3 is a schematic diagram of a chip enable buffer circuit used in the FIG. 1 circuit.

FIG. 3 is a typical implementation of chip enable buffer 10 of FIG. 1. The chip enable buffer of FIG. 3 receives the chip enable signal "-CE" at input pin 48 (connected to pad 8 shown in FIG. 1) of TTL buffer 50, and optionally also receives a "-Power Up" signal at input pin 49 of buffer 50. The function of "-Power Up" is to activate the FIG. 3 circuit when it is in a "deep power down" mode. The latter mode is different from the above-mentioned "standby mode" (triggered by a "high" value of chip enable signal -CE) in that power is disconnected from more components of the FIG. 1 circuit in deep power down than in standby, and in that different external devices supply signals "-CE" and "-Power Up." Because the FIG. 3 circuit responds identically to identical transitions of signals -Power Up and -CE, operation of the FIG. 3 system will be further described with reference to signal -CE only.

The FIG. 3 circuit is designed to minimize inherent delays in generating signal -CEint. This is important because the address buffers (A0 through Ap) are some of the first elements that need to be powered up by a low value of -CEint (in response to a low value of -CE), so that delay in generating a low-going transition of -CEint is directly in the speed path of the FIG. 1 chip. The FIG. 3 circuit must also be designed so that the signal -CEint has sufficient current drive capability to drive the necessary load. These design requirements are met by connecting the output of buffer 50 (an inverting amplifier) to a sequence of buffers (inverters) 52, 54, 56, 58, and 60 connected in series. The size of each inverter (52, 54, 56, 58, and 60) in this sequence is such that the final inverter (60) outputs a signal -CEint adequate to drive the load. The ratio of the sizes of successive inverters in the sequence is selected to minimize the delay in asserting the output signal -CEint (each inverter in the sequence typically has a larger size than the previous inverter in the sequence), so that the final buffer outputs signal -CEint with sufficiently short delay time.

The gate of P-channel MOS transistor 62 is connected to the output of inverter 52. In response to a low-going edge of -CE (triggering a standby-to-active transition of the FIG. 1 circuit), the output of inverter 52 also undergoes a high-to-low voltage transition, thus switching transistor 62 "on." More specifically, once the trip voltage of inverter 52 is reached, the output of inverter 52 will go low. The low voltage at the output of inverter 52 is fed back to transistor 62 and will cause transistor 62 to turn on thereby causing the voltage at the input to inverter 52 to be pulled up even higher. This positive feedback provides hysteresis, so that the magnitude of the low-to-high transition applied to pin 48 that is necessary to trigger an active-to-standby mode transition of the FIG. 1 circuit, is reduced. Thus, once the FIG. 1 circuit has entered the active mode, a slight increase in the low voltage applied to pin 48 (due to noise or the like) will not cause the FIG. 1 circuit to exit the active mode.

In response to a high-going edge of -CE (triggering an active-to-standby transition of the FIG. 1 circuit), the output of inverter 52 also undergoes a low-to-high voltage transition, thus switching transistor 62 "off."

A significant problem resulting during operation of the conventional FIG. 1 circuit will next be described in connection with the timing diagram of FIG. 4. This problem is that a longer time (denoted $T_{CE}$) is required for a memory access when the FIG. 1 circuit is in its standby mode, than the time (denoted $T_{AA}$) required for a memory access when the FIG. 1 circuit is in its active mode (enabled by a low value of signals -CE and -CEint).

Figure 4:
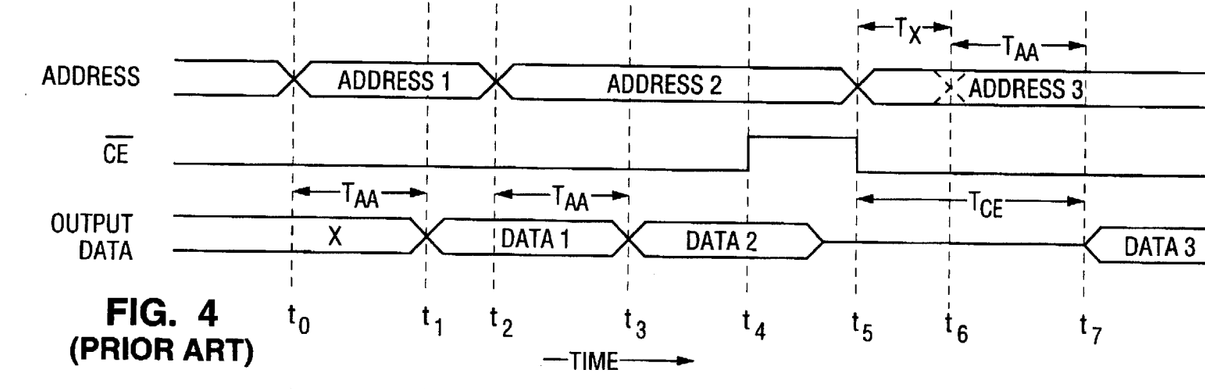
FIG. 4 is a timing diagram illustrating the operation of the FIG. 1 circuit.

FIG. 4 assumes that the FIG. 1 circuit is active (-CE is low) from time to through time $t_4$, and is in a "read" mode (in which it outputs a stored data value from memory 16 in response to an address received at address buffers A0–Ap). At time $t_0$, the circuit receives a first address (a first set of values of address signals X0–Xn and Y0–Ym) at its address buffers. Due to the time inherently required for responding to this address in address buffers A0–Ap, decoders 12 and 14, memory array circuit 16 (which can be an array of flash memory cells), sense amplifier 18 and output buffer 20, it is not until time $t_1$ that the output of buffer 20 represents valid data. Similarly, in response to a second address asserted at time $t_2$, it is not until time $t_3$ that the output of buffer 20 represents a second valid quantity of data. The time delay, $(t_1-t_0)=(t_3-t_2)=T_{AA}$ (known as "address access" time), is typically 60 ns (in a CMOS integrated circuit implementation of FIG. 1 in which memory array 16 is an array of flash memory cells).

FIG. 4 assumes that the circuit enters a standby mode (-CE goes high) at time $t_4$. Then, at time $t_5$, it receives a third address at its address buffers, and -CE goes low. Due to the time ($T_X$) inherently required by buffer 10 to respond to this high-to-low transition of signal -CE by causing a corresponding high-to-low transition of its output signal -CEint, it is not until time $t_6$ that the address buffers are enabled (and thus able to recognize and respond to the "third address" asserted thereto). An additional address access time $T_{AA}$ is then required (from time $t_6$ to time $t_7$) before the output of buffer 20 represents a third valid quantity of data (the data indexed by the third address). Buffer 20 becomes disabled (shortly after time $t_4$) in response to the low-to-high transition of -CE at time $t_4$, and thus its output represents invalid data from the time it becomes disabled until time $t_7$.

The time delay $T_X$ is typically 5 ns to 10 ns (in an integrated circuit implementation of FIG. 2). Thus, the time delay, $(t_7-t_5)=T_{AA}+T_X=T_{CE}$ (known as "chip enable access" time), is typically 65 ns to 70 ns (in the above-mentioned CMOS integrated circuit implementation of FIG. 1 in which memory array 16 is an array of flash memory cells).

We denote as the "$T_{CE}$ effect" the problem of longer response time required for responding to a command (such as a "read" command to a memory chip) from a "standby" mode than from an "active" mode. Of course, memory circuits other than those of the type shown in FIG. 1, and circuits other than memory circuits, are subject to the $T_{CE}$ effect.

A circuit embodying the present invention is not subject to the $T_{CE}$ effect (to a selected degree), and thus can respond with decreased average response time to a sequence of commands (e.g., memory access commands, in memory circuit embodiments of the invention).

SUMMARY OF THE INVENTION

The invention is a circuit including a means for responding to an external standby command (a transition in a control signal from an external device) by generating a delayed internal standby signal. The internal standby signal is provided to at least one component of the circuit to switch each such component from an "active" mode to a "standby" mode. In preferred embodiments, the circuit of the invention is a memory circuit implemented as an integrated circuit (preferably a CMOS integrated circuit).

The amount of the delay in generating the delayed internal standby signal ("standby delay") is selected to achieve a desired decreased average response time to a sequence of commands (e.g., memory access commands in memory circuit embodiments of the invention), without excessive power consumption. In preferred embodiments in which the inventive circuit is a memory chip (e.g., a memory chip including a flash memory array) having an address access time in the range from about 60 nanoseconds (ns) to about 80 ns, the delay will typically be in the range from about 100 ns to about 200 ns.

In a class of preferred embodiments, the circuit of the invention generates two internal standby signals (one delayed with respect to the other) in response to an external standby command (a first type of transition in a chip enable signal from an external device). At least a first component of the circuit (e.g., an address buffer) receives the delayed internal standby signal (and enters a standby mode in response thereto), and at least a second component of the circuit receives the non-delayed internal standby signal (and enters a standby mode in response thereto). In response to an external "enable" command (a second type of transition in the chip enable signal from the external device), the circuit generates two internal enable signals which activate both the first and the second components substantially simultaneously (the internal enable signal are not delayed significantly with respect to each other).

DETAILED DESCRIPTION OF THE INVENTION

Figure 5:
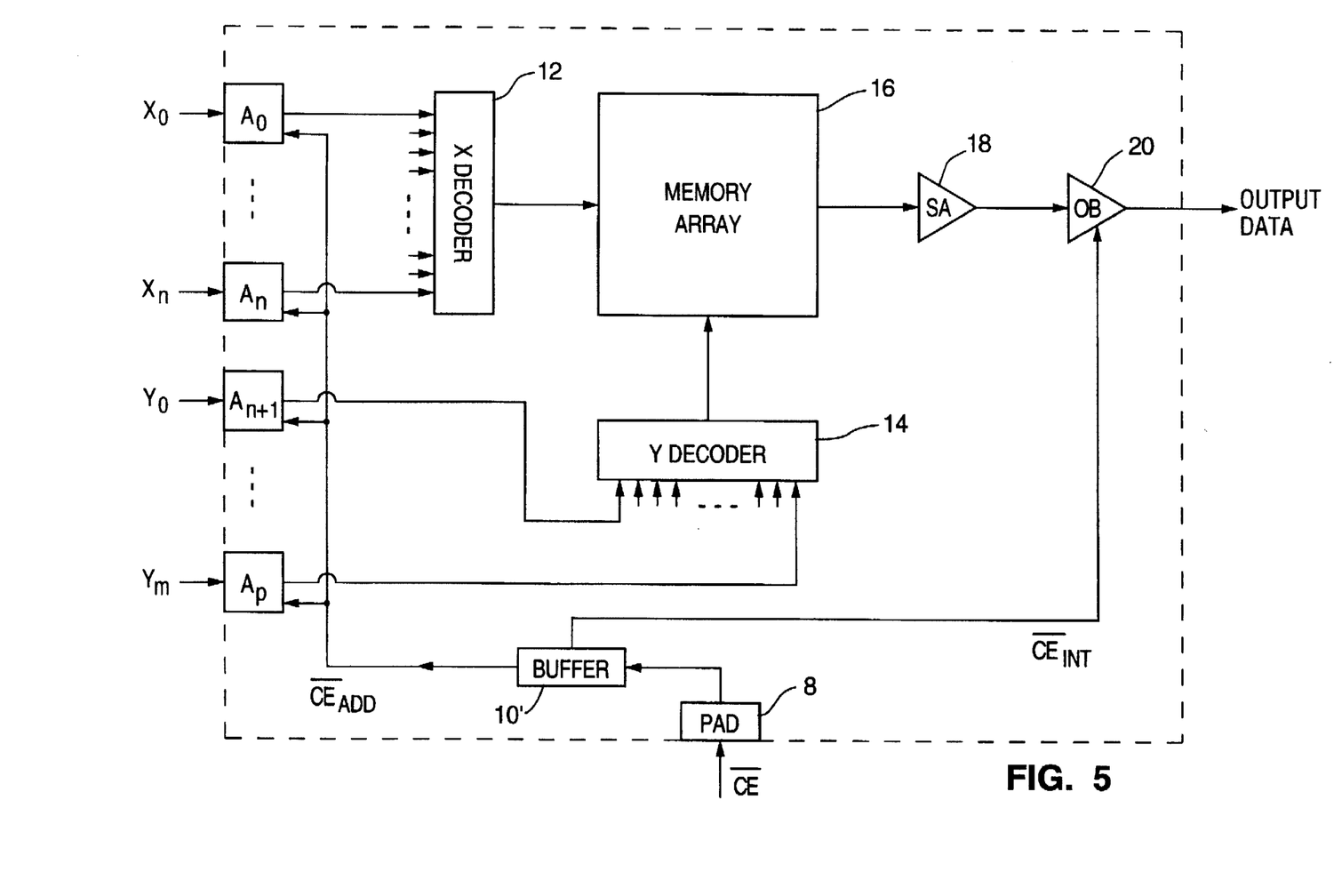
FIG. 5 is a block diagram of an integrated circuit which embodies the present invention, including chip enable buffer 10' for generating two chip enable signals (-CEint and -CEadd) in response to a chip enable command (-CE).

FIG. 5 is a block diagram of a memory circuit which is implemented an integrated circuit and which embodies the invention. In preferred embodiments, memory array circuit 16 of FIG. 5 is an array of flash memory cells. The FIG. 5 circuit is identical to the FIG. 1 circuit, except in that the FIG. 5 circuit includes a chip enable buffer 10' which generates two chip enable signals (-CEint and -CEadd) in response to a chip enable command (-CE), rather than the conventional chip enable buffer 10 of FIG. 1. Identical components (and their input and output signals) of FIGS. 1 and 5 are identically numbered, and the description of them set forth above will not be repeated.

Chip enable buffer 10' responds to an external standby command (a low-going transition in signal -CE received at pad 8 from an external device) by generating a delayed internal standby signal (a low-going transition in signal -CEadd) which is provided to address buffers A0-Ap to switch the address buffers from an "active" to a "standby" mode.

Although not required in alternative embodiments of the invention, buffer 10' of FIG. 5 circuit generates a second (non-delayed) internal standby signal (a non-delayed low-going transition in signal -CEint) in addition to the delayed internal standby signal, in response to the external standby command. At least one component of the FIG. 5 circuit (e.g., output buffer 20) receives the non-delayed internal standby signal (and enters a standby mode in response thereto).

In response to an external "enable" command (a high-going transition in signal -CE), the FIG. 5 circuit generates two internal enable signals (high-going transitions in both signal -CEadd and signal -CEint) which activate all the components to which they are supplied (e.g., address buffers A0-Ap and output buffer 20) substantially simultaneously. The internal enable signals are not delayed significantly with respect to each other.

The amount of the delay in generating the delayed internal standby signal (sometimes referred to below as "standby delay") is selected to achieve a desired decreased average response time to a sequence of memory access commands asserted to the FIG. 5 circuit (in a manner to be explained below) without excessive power consumption (in the sense that excessively long delay will cause at least some components of the circuit to enter the standby mode very seldom and instead almost always to remain in the "active" mode). In preferred implementations of FIG. 5 in which the address access time (the time $T_{AA}$ described above with reference to FIG. 4) is in the range from 60 ns to 80 ns, the delay will typically be in the range from about 100 ns to about 200 ns (and preferably equal to about 150 ns). In this case, address buffers A0-Ap will remain enabled in the delay period (e.g., for 150 ns) after each assertion of an external standby command. Thus, if a memory access command is received (by the FIG. 5 circuit) in such delay period, the enabled address buffers will be able to respond rapidly. If no memory access command is received during the delay period, the address buffers will enter the standby mode so that in response to the next memory access command (and associated external chip enable command) there will be a delay (the time $T_X$ described above with reference to FIG. 4) associated with enabling the address buffers, before the FIG. 5 circuit can carry out the required memory access.

The invention significantly reduces time-averaged memory access time (or other time-averaged circuit response time) in applications of the inventive circuit in which memory access commands (or other commands) occur with high frequency (i.e., greater than the inverse of the "standby delay" associated with the delayed internal standby signal) over significant periods of time. Thus, the preferred 150 ns standby delay results in significantly reduced time-averaged memory access time for the FIG. 5 circuit (relative to the FIG. 1 circuit) in applications in which memory access commands (and thus, transitions of control signal -CE) occur with frequency greater than 6.7 MHz= $(150\text{ ns})^{-1}$ over significant periods of time. Many commercially available CPU chips are sufficiently fast that, when used with the preferred embodiment of the memory chip of FIG. 5 (with standby delay in the range from 100 ns to 200 ns), they will not see a $T_X$ delay (i.e., they will not be subject to the above-defined $T_{CE}$ effect) even if they undergo a wait state between assertion of memory access commands. Chip enable buffer 10' should be designed to implement a standby delay time appropriate for the intended application of the FIG. 5 circuit. Preferably, the standby delay time is selected to be longer than the inverse of the expected maximum frequency of external control signal transitions at pad 8 of the FIG. 5 circuit. More generally, all embodiments of the invention should be designed to implement a standby delay time appropriate for their intended application (preferably so that the standby delay time is longer than the inverse of an expected maximum frequency of external control signal transitions).

As a result of embodying the invention, the FIG. 5 circuit will consume somewhat more power (averaged over time) than the conventional FIG. 1 circuit because its address buffers will remain enabled longer (on a time-averaged basis) than the address buffers of the FIG. 1 circuit. However, the extra current consumption in the enabled mode of the address buffers (relative to the standby mode) is a DC phenomenon, and thus the increased time-averaged power consumption will be insignificant in most applications of the FIG. 5 circuit.

Figure 6:
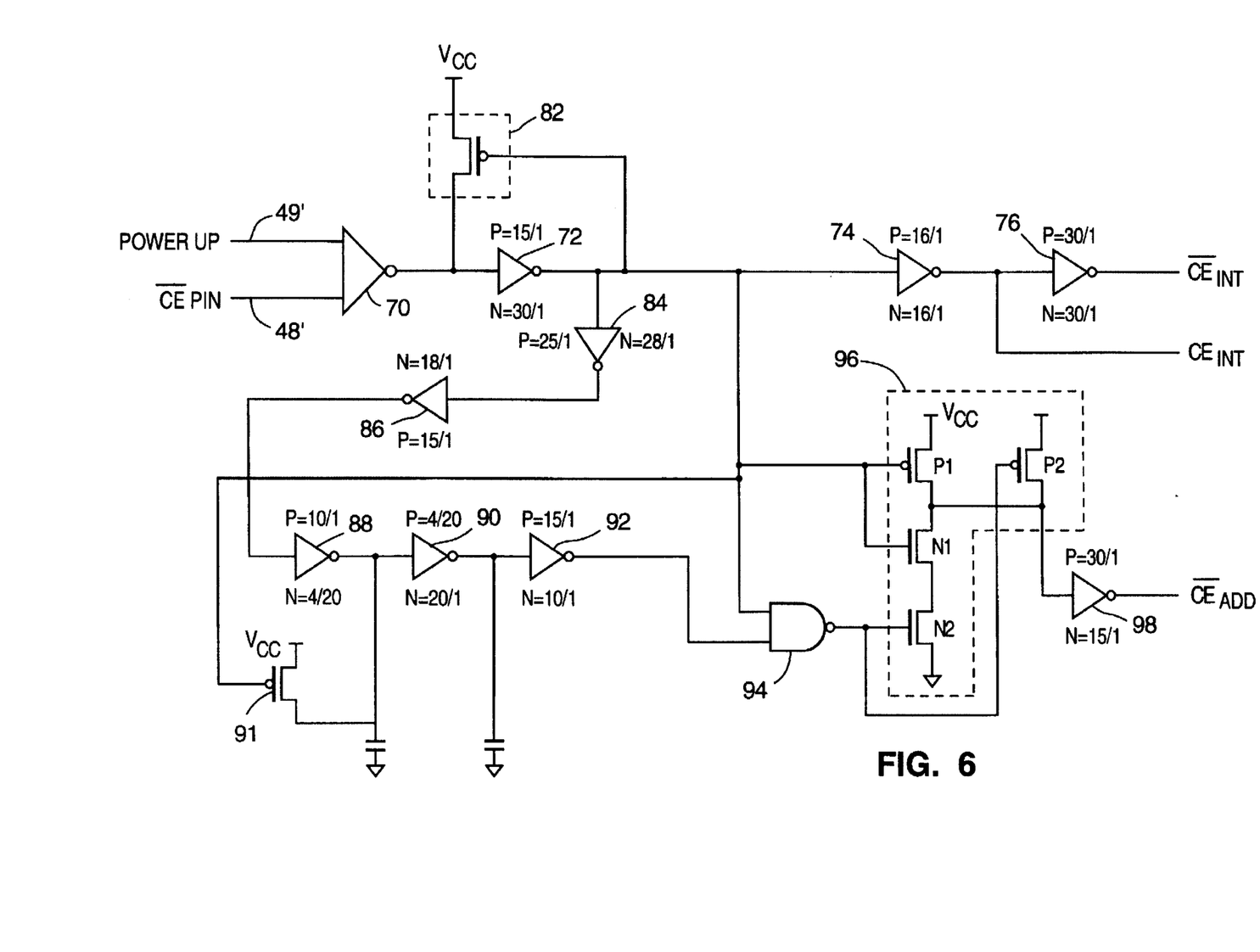
FIG. 6 is a schematic diagram of a chip enable buffer circuit used in the FIG. 5 circuit.

Next, with reference to FIG. 6, we describe a preferred implementation of chip enable buffer 10' of the FIG. 5 circuit. The chip enable buffer of FIG. 6 is preferably implemented as an integrated circuit (a portion of an integrated circuit implementation of FIG. 5). The FIG. 6 circuit receives chip enable signal "-CE" at input pin 48' (connected to pad 8 shown in FIG. 5) of TTL buffer 70, and optionally also receives a "-Power Up" signal at input pin 49' of buffer 70. The function of "-Power Up" is the same as that of the "-Power Up" signal described above with reference to FIG. 3. Because the FIG. 6 circuit responds identically to identical transitions of signals -Power Up and -CE, operation of the FIG. 6 circuit will be further described with reference to signal -CE only.

The FIG. 6 circuit is designed to minimize inherent delays in generating signal -CEint (for the above-described reasons that the FIG. 3 circuit is designed to minimize such delays). The FIG. 6 circuit must be designed so that the signal -CEint has sufficient current driving capability to drive the necessary load.

The function of buffer 70 of FIG. 6 is the same as that of corresponding buffer 50 of FIG. 3. The function of transistor 82 of FIG. 6 is the same as that of corresponding transistor 62 of FIG. 3. The function of sequence of buffers (inverters) 72, 74, and 76 connected in series in FIG. 6 is the same as that of corresponding sequence of buffers 52, 54, 56, 58, and 60 of FIG. 3. There are fewer inverters in the "-CEint signal" generation branch of FIG. 6 than in the corresponding inverter sequence in FIG. 3 (three inverters, namely 72, 74, and 76 in FIG. 6, as opposed to five, namely 52, 54, 56, 58, and 60 in FIG. 3) because the load driven by signal -CEint produced at the output of inverter 76 of FIG. 6 is expected to be smaller than the load driven by signal -CEint produced at the output of inverter 60 of FIG. 3 (since signal -CEint produced at the output of inverter 76 of FIG. 6 is not supplied to address buffers A0–Ap of FIG. 5). The ratio of the sizes of successive inverters 72, 74, and 76 in the -CEint branch of FIG. 6 is selected to minimize the delay in asserting output signal -CEint (each inverter in the sequence typically has a larger size than the previous inverter in the sequence), so that buffer 76 outputs signal -CEint with sufficiently short delay time.

Because there are an odd number of inverters (three) connected to the output of inverter 70 in the -CEint generation branch of FIG. 6, -CEint will follow -CE.

The gate of P-channel MOS transistor 82 is connected to the output of inverter 72. In response to a low-going edge of -CE (triggering a standby-to-active transition of the FIG. 5 circuit), the output of inverter 72 also undergoes a high-to-low voltage transition, thus switching transistor 82 "on." More specifically, once the trip voltage of inverter 72 is reached, the output of inverter 72 will go low. The low voltage at the output of inverter 72 is fed back to transistor 82 and will cause transistor 82 to turn on thereby causing the voltage at the input to inverter 72 to be pulled up even higher. This positive feedback provides hysteresis, so that the magnitude of the low-to-high transition applied to pin 48' that is necessary to trigger an active-to-standby mode transition of the FIG. 5 circuit, is reduced. Thus, once the FIG. 5 circuit has entered the active mode, a slight increase in the low voltage applied to pin 48' (due to noise or the like) will not cause the FIG. 5 circuit to exit the active mode. In response to a high-going edge of -CE (triggering an active-to-standby transition of the FIG. 5 circuit), the output of inverter 72 also undergoes a low-to-high voltage transition, thus switching transistor 82 "off."

The "-CEadd signal" generation branch of FIG. 6 consists of a sequence of buffers (inverters) 72, 84, 86, 88, 90, 92 connected in series, P-channel MOS transistor 82 connected as shown (with its gate connected to the output of inverter 72), NAND gate 94 and NAND gate 96 connected as shown, and inverter 98 connected to the output of NAND gate 96. NAND gate 96 includes a CMOS inverter comprising P-channel MOS transistor P1 and N-channel MOS transistor N1, a P-channel MOS transistor P2, and an N-channel MOS transistor N2 connected as shown. This branch of the FIG. 6 circuit is designed to implement the above-described "standby delay" in a high-going transition of output signal -CEadd, while also causing each low-going transition of output signal -CEadd to coincide with each low-going transition of output signal -CEint. Thus, the high-going transitions of output signal -CEadd are delayed (by a "standby delay" of 150 ns in a preferred embodiment) relative to high-going transitions of input chip enable signal -CE. However, the coinciding low-going transitions of -CEint and -CEadd are not delayed relative to the low-going transitions of input chip enable signal -CE. Instead, the low-going transitions of -CEint and -CEadd follow the low-going transitions of -CE as rapidly as practical (this is important because address buffers A0–Ap are some of the first elements that need to be powered up by a low value of -CEadd in response to a low value of -CE, so that the delay in generating low-going transitions of -CEadd is directly in the speed path of the FIG. 5 chip). Inverters 72 and 98 and NAND gate 96 of FIG. 6 must be designed so that the signal -CEadd has sufficient current driving capability to drive the necessary load (including the address buffers of FIG. 5). The size of each of inverters 72 and 98 and NAND gate 96 is such that the final inverter (98) outputs a signal -CEadd adequate to drive the necessary load. The ratio of the sizes of successive inverters in the sequence comprising 72, 84, 86, 88, 90, and 92 is selected to achieve the desired standby delay in asserting high-going transitions of output signal -CEadd (each inverter in the sequence typically has a larger size than the previous inverter in the sequence).

In response to a low-going transition of signal -CE, the output of inverter 72 rapidly goes low, thus rapidly turning "on" NAND gate 96 and causing the input of inverter 98 rapidly to be pulled high to $V_{CC}$. Thus, -CEadd rapidly goes low.

In contrast, in response to a high-going transition of signal -CE, the output of inverter 72 (and thus one input of each of NAND gates 94 and 96) rapidly goes high. The other input of NAND gate 94 undergoes a delayed high-to-low transition, with the result that the output of NAND gate 94 (which is the other input to NAND gate 96) undergoes a delayed low-to-high transition. Because the other input to NAND gate 96 has rapidly gone high, the output of NAND gate 96 undergoes a delayed high-to-low transition, and -CEadd (the output of inverter 98) thus undergoes a delayed low-to-high transition.

The FIG. 6 circuit preferably includes circuitry for precharging the internal nodes of the delay stage for fast recovery time. This is done so that if there are spurious transitions on -CE pin 48, the delay stage does not respond and undesirably have variable response timings.

Operation of the FIG. 5 circuit will next be described in connection with the timing diagram of FIG. 7. Comparison of FIG. 7 with the conventional FIG. 4 timing diagram illustrates how the invention avoids the undesirable $T_{CE}$ effect described above.

Figure 7:
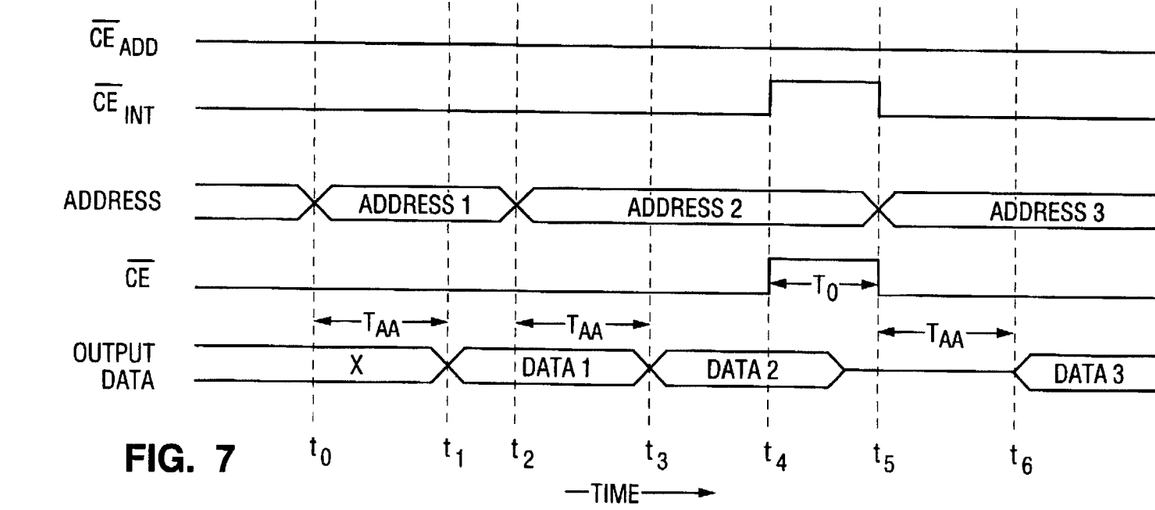
FIG. 7 is a timing diagram illustrating the operation of the FIG. 5 circuit.

FIG. 7 assumes that the FIG. 5 circuit is active (-CE is low) from time to through time $t_4$, and is in a "read" mode in which it outputs a stored data value from memory 16 in response to an address received at address buffers A0–Ap. At time $t_0$, the circuit receives a first address (a first set of values of address signals X0–Xn and Y0–Ym) at its address buffers. Due to the time inherently required for responding to this address in address buffers A0–Ap, decoders 12 and 14, memory array circuit 16 (preferably an array of flash memory cells), sense amplifier 18 and output buffer 20, it is not until time $t_1$ that the output of buffer 20 represents valid data. Similarly, in response to a second address asserted at time $t_2$, it is not until time $t_3$ that the output of buffer 20 represents a second valid quantity of data. The address access time, $(t_1-t_0)=(t_3-t_2)=T_{AA}$, is typically 60 ns (in a CMOS integrated circuit implementation of FIG. 5 in which memory array 16 is an array of flash memory cells).

FIG. 7 assumes that the FIG. 5 circuit enters a standby mode (-CE goes high) at time $t_4$. Then, at time $t_5$, it receives a third address at its address buffers, and -CE goes low. Buffer 10' responds to each of these transitions of signal -CE by rapidly generating corresponding transitions of its first output signal -CEint. However, if the "standby delay" (defined above) of buffer 10' is greater than $T_D=t_5-t_4$, buffer 10' will not have generated a low-to-high transition of its other output signal -CEadd (in response to the low-to-high transition of signal -CE at time $t_4$) as of time $t_5$.

Thus, the address buffers will remain enabled (and thus able to recognize and respond to the "third address" asserted thereto) at time $t_5$. Thus, only the inherent address access time $T_{AA}$ is required (from time $t_5$ to time $t_6$) before the output of buffer 20 represents a third valid quantity of data (the data indexed by the third address). Buffer 20 becomes disabled (shortly after time $t_4$) in response to the low-to-high transition of -CEint at time $t_4$, and thus its output represents invalid data from the time it becomes disabled until time $t_6$.

If the "standby delay" of buffer 10' had been less than $T_D=t_5-t_4$ (contrary to the assumption implicit in FIG. 7), output signal -CEadd from buffer 10' would have undergone a low-to-high transition (in response to the low-to-high transition of signal -CE at time $t_4$) before time $t_5$. In such implementation of the FIG. 5 circuit, the invention would not avoid the $T_{CE}$ effect in responding to the particular sequence of transitions of signal -CE (and assertion of a new address at time $t_5$) shown in FIG. 7.

A preferred embodiment of the invention has been described with reference to FIGS. 5, 6, and 7. Although one preferred embodiment has been described in some detail, it is contemplated that changes from this embodiment can be made without departing from the spirit and scope of the invention as defined by the appended claims.

What is claimed is:

1. An integrated circuit having enable control circuitry responsive to an external control signal, the external control signal having a first state and a second state, said integrated circuit including:

a plurality of integrated circuit pins which provide an interface between the integrated circuit and its external environment;

a chip enable circuit which receives the external control signal on a first one of the pins and produces in response a first control signal and a second control signal, wherein the chip enable circuit produces a first transition of the first control signal and a first transition of the second control signal when the external control signal goes from the first state to the second state, a second transition of the first control signal when the external control signal goes from the second state to the first state, and a second transition of the second control signal when the external control signal goes from the second to the first state, wherein the chip enable circuit produces the second transition of the second control signal a first delay period after producing the second transition of the first control signal;

a first circuit which is switchable to an enabled state in response to receipt of the first transition of the second control signal and to a disabled state in response to receipt of the second transition of the second control signal; and a second circuit which is switchable to an enabled state in response to receipt of the first transition of the first control signal and to a disabled state in response to receipt of the second transition of the first control signal, whereby both the first circuit and the second circuit are enabled by the first transition of the first control signal and the first transition of the second control signal at substantially the same time after the external control signal goes from the first to the second state, the second circuit is disabled after the external control signal goes from the second state to the first state, and the first circuit is not disabled until said first delay period after the second circuit is disabled so that the first circuit remains enabled if there is a subsequent transition in the external control signal from the first state to the second state within said first delay period.

2. The integrated circuit of claim 1, wherein the external control signal has a maximum frequency, and the first delay period is longer than the inverse of said maximum frequency.

3. The integrated circuit of claim 1, wherein the integrated circuit is a memory circuit including address buffers and a memory array, and the first circuit includes said address buffers.

4. The integrated circuit of claim 1, wherein the first delay period is selected to achieve a desired decreased average response time of the second circuit to a sequence of commands.

5. The integrated circuit of claim 4, wherein the sequence of commands is a sequence of memory access commands.

6. The integrated circuit of claim 1, wherein said integrated circuit is a memory circuit having an address access time and including address buffers, the first circuit includes said address buffers, and the first delay period is greater than said address access time.

7. The integrated circuit of claim 6, wherein the address access time is in a range from 60 nanoseconds to 80 nanoseconds, and the first delay period is in a range from 100 nanoseconds to 200 nanoseconds.

8. An integrated circuit, including:

a pad, which is connectable to an external device;

address buffers;

a memory array circuit;

an address decoder circuit connected between the address buffers and the memory array circuit; and a chip enable buffer, connected to the pad so that said chip enable buffer receives a control signal supplied to the pad from the external device, said control signal having a first state and a second state, said chip enable buffer comprising:

a first enable circuit, configured to receive a signal indicative of each transition of the control signal and to generate a delayed internal standby signal in response to a transition of the control signal from the second state to the first state, such that the delayed internal standby signal has a standby delay relative to said transition; and     a second enable circuit, configured to receive said signal indicative of each transition of the control signal and to generate an internal chip enable signal in response to a transition of the control signal from the first state to the second state, wherein generation of the internal chip enable signal is accomplished with a delay much shorter than said standby delay relative to said transition of the control signal from the first state to the second state, wherein the address buffers are connected to the chip enable buffer and configured to receive the delayed internal standby signal from the chip enable buffer, and each of the address buffers is configured to operate in a standby mode consuming low power in response to the delayed internal standby signal.

9. The integrated circuit of claim 8, also including:

a control line connected between the chip enable buffer and the address buffers, wherein the internal chip enable signal is a transition on the control line from a first level to a second level, and the delayed internal standby signal is a transition on the control line from the second level to the first level, and each of the address buffers is operable in a selected one of an active mode and said standby mode in response to status of the control line.

10. The integrated circuit of claim 8, wherein said integrated circuit has an address access time, and the standby delay is greater than said address access time.

11. The integrated circuit of claim 10, wherein the address access time is in a range from 60 nanoseconds to 80 nanoseconds, and the standby delay is in a range from 100 nanoseconds to 200 nanoseconds.

12. A standby signal generation circuit for generating a delayed internal standby signal for controlling a second circuit, said standby signal generation circuit including:

an input branch for receiving a control signal from an external device, wherein the control signal has at least a first state and a second state, and generating an output signal having an output state which rapidly follows the state of the control signal;

a first branch including a first set of inverters connected in series for receiving the output signal, and generating a non-delayed internal standby signal in response to a transition of the output signal indicative of a transition of the control signal from the second state to the first state;

a second branch including a second set of an odd number of inverters connected in series for receiving the output signal and generating a delayed inverted output signal in response to said transition of the output signal indicative of said transition of the control signal from the second state to the first state; and     logic circuitry connected for receiving the output signal and the delayed inverted output signal, and generating the delayed internal standby signal in response to said delayed inverted output signal and said output signal, such that the delayed internal standby signal has a standby delay relative to said transition of the control signal from the second state to the first state, wherein the second branch includes a first circuit connected to the logic circuitry and configured to generate a non-delayed signal in response to a transition of the output signal indicative of a transition of the control signal from the first state to the second state, and to assert said non-delayed signal to the logic circuitry, wherein the logic circuitry includes a third circuit configured to generate an internal enable signal in response to said non-delayed signal and said transition of the output signal indicative of said transition of the control signal from the first state to the second state, wherein generation of the internal enable signal is accomplished with a delay much shorter than said standby delay.

13. The circuit of claim 12, wherein the input branch, the first branch, the second branch, and the logic circuitry are components of a memory circuit, and said memory circuit also includes address buffers and a fourth circuit configured to supply the delayed internal standby signal to the address buffers.

\* \* \* \* \*